(12) United States Patent  
Lee

(10) Patent No.: US 7,704,817 B2
(45) Date of Patent: Apr. 27, 2010

(54) METHOD FOR MANUFACTURING SEMICONDUCTOR DEVICE

(75) Inventor: Sang Yong Lee, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 236 days.

(21) Appl. No.: 11/567,091

(22) Filed: Dec. 5, 2006

(65) Prior Publication Data

US 2007/0131964 A1    Jun. 14, 2007

(30) Foreign Application Priority Data

Dec. 13, 2005   (KR) .................... 10-2005-0122508

(51) Int. Cl.
*H01L 21/8236* (2006.01)
(52) U.S. Cl. ................. 438/199; 257/E27.064
(58) Field of Classification Search ........... 257/139, 257/E29.157, E27.064, E21.632; 438/142, 438/199
See application file for complete search history.

(56) References Cited

U.S. PATENT DOCUMENTS

| 4,735,915 | A * | 4/1988 | Kita et al. ............... 438/250 |
| 2003/0211730 | A1 * | 11/2003 | Park ....................... 438/637 |
| 2005/0064721 | A1 * | 3/2005 | Tsai et al. ............... 438/740 |
| 2005/0164460 | A1 * | 7/2005 | Mathew et al. ........... 438/304 |
| 2006/0157795 | A1 * | 7/2006 | Chen et al. .............. 257/369 |
| 2006/0234455 | A1 * | 10/2006 | Chen et al. .............. 438/276 |
| 2007/0235813 | A1 * | 10/2007 | Zia et al. ............... 257/369 |

FOREIGN PATENT DOCUMENTS

CN    1484285    3/2004

* cited by examiner

*Primary Examiner*—Thao P. Le
(74) *Attorney, Agent, or Firm*—Sherr & Vaughn, PLLC

(57) ABSTRACT

Embodiments relate to a semiconductor device and a method of manufacturing the same. According to embodiments, a semiconductor device may include a gate insulating layer and a gate electrode formed on a semiconductor substrate with an isolation layer, a low-density junction region formed at both sides of the gate electrode, a patterned insulating layer formed while exposing a portion of the low-density junction region, and a high-density junction region formed beneath the exposed low-density junction region of the semiconductor substrate.

13 Claims, 5 Drawing Sheets

METHOD FOR MANUFACTURING SEMICONDUCTOR DEVICE

The present application claims priority under 35 U.S.C. 119 and 35 U.S.C. 365 to Korean Patent Application No. 10-2005-0122508 (filed on Dec. 13, 2005), which is hereby incorporated by reference in its entirety.

BACKGROUND

Embodiments relate to a semiconductor device and a method of manufacturing the same.

A semiconductor device may include a semiconductor substrate with high-density and low-density junction regions isolated from each other about a channel region. A semiconductor device may further include a gate insulating layer and a gate electrode that may be sequentially formed on the channel region. A spacer may be formed on sidewalls of the gate insulating layer and the gate electrode while existing on the low-density junction region. A gap fill oxidation may be formed on an entire surface of the semiconductor substrate and may have a contact hole thereon. A metal interconnection may be electrically connected to the high-density junction region of the semiconductor substrate through the contact hole.

The spacer may be used to form the low-density junction region and to isolate adjacent gate electrodes from each other. This may prevent a punchthrough from being produced in a semiconductor device due to a short channel effect that may occur as a length of a channel is reduced due to the high level of integration of the semiconductor device.

Such a spacer may be formed by depositing a spacer insulating layer on a semiconductor substrate and a gate electrode and performing an etch-back process.

However, the spacer insulating layer may be deposited at a high temperature, for example of about 800° C. Therefore, dopants formed on a semiconductor substrate may be diffused into a channel region and a short channel effect may occur. Accordingly, operational characteristics of a semiconductor device may be degraded.

Further, since it may be difficult to control a region of the spacer through a related art etch-back process, the spacer formed on a sidewall of a gate electrode may have a broad width. Moreover, it may be difficult to adjust a width of the related art spacer. Accordingly, since an isolation space between adjacent gate electrodes may be reduced due to the broad width of the spacer, an interior of a gap between the gate electrodes may not be sufficiently filled with an oxidation film. Voids may therefore occur. Such voids may degrade the reliability of a semiconductor device because they may induce a leakage current when driving the semiconductor device.

SUMMARY

Embodiments relate to a semiconductor device and a method of manufacturing the same that may be capable of enhancing characteristics and reliability of the semiconductor device by preventing voids produced as an isolation space between gate electrodes becomes narrow.

In embodiments, a semiconductor device may include a gate insulating layer and a gate electrode formed on a semiconductor substrate with an isolation layer, a low-density junction region formed at both sides of the gate electrode, a patterned insulating layer formed while exposing a portion of the low-density junction region, and a high-density junction region formed beneath the exposed low-density junction region of the semiconductor substrate.

In embodiments, a method of manufacturing a semiconductor device may include sequentially forming a gate insulating layer and a gate electrode on a semiconductor substrate with an isolation layer formed thereon, implanting low-density dopants onto the semiconductor substrate to form a low-density junction region at both sides of the gate electrode, forming a patterned insulating layer partially exposing the low-density junction region, and implanting high-density dopants onto the semiconductor substrate of the exposed low-density junction region to form a high-density junction region at both sides of the gate electrode.

DETAILED DESCRIPTION OF EMBODIMENTS

Figure 1:
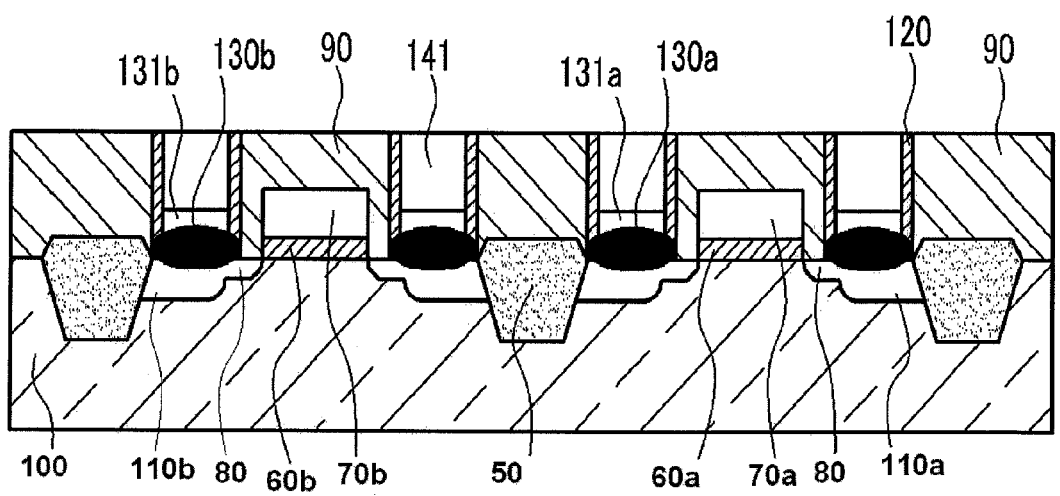
FIG. 1 is an example sectional view of a semiconductor device according to embodiments.

Referring to FIG. 1, according to embodiments, gate insulating layers 60a and 60b and gate electrodes 70a and 70b may be formed on semiconductor substrate 100 with isolation layers 50 formed thereon. Low-density junction regions 80 may be respectively formed at both sides of each of gate electrodes 70a and 70b. Patterned insulating layer 90 may be formed while exposing portions of the low-density junction regions 80. High-density junction regions 110a and 110b may be respectively formed beneath the exposed low-density junction regions 80 of semiconductor substrate 100.

In embodiments, patterned insulating layer 90 may be formed on tops of isolation layers 50 and on side and top surfaces of gate electrodes 70a and 70b, and may serve as a spacer.

Figure 3:
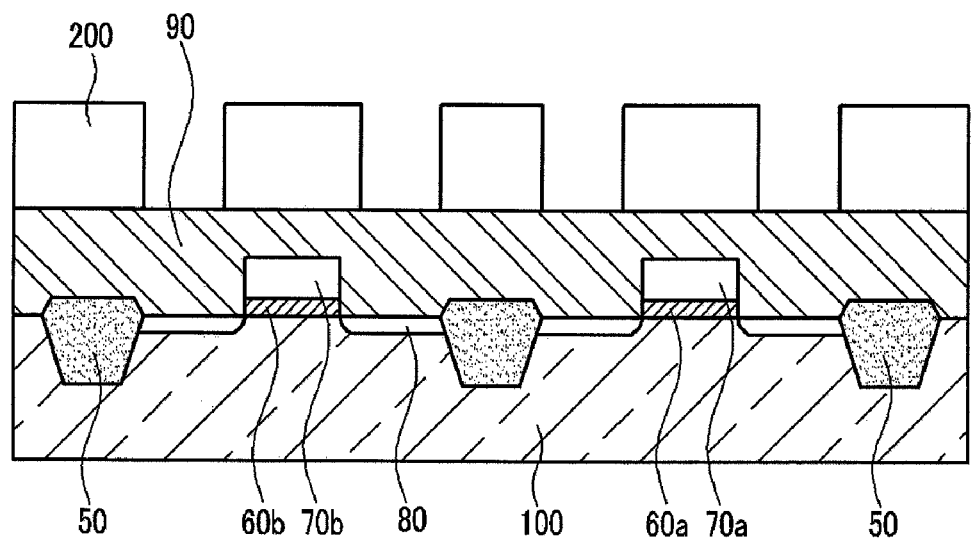

Further, since patterned insulating layer 90 may be positioned on the top and sidewalls of gate electrodes 70a and 70b, a width of patterned insulating layer 90 may be adjusted by photoresist 200 (FIG. 3). In embodiments, it may not be difficult to adjust the width. Thus, the gap formed between gate electrodes 70a and 70b with a narrow isolation space may be sufficiently filled with an intermetallic dielectric material. In this way, voids may be prevented. Accordingly, electrical characteristics and reliability of the semiconductor device may be enhanced.

According to embodiments, a semiconductor device may further include first barrier metal film 120 that may be formed on patterned insulating layer 90, and salicide layers 130a and 130b that may be formed on low-density junction regions 80 of semiconductor substrate 100, respectively.

According to embodiments, a semiconductor device may further include second barrier metal films 131a and 131b that may be formed on the salicide layers 130a and 130b, respectively, and metal interconnections 141 that may be formed on second barrier metal films 131a and 131b.

FIGS. 2 to 9 are example sectional views illustrating a process of manufacturing a semiconductor device according to embodiments.

Figure 2:
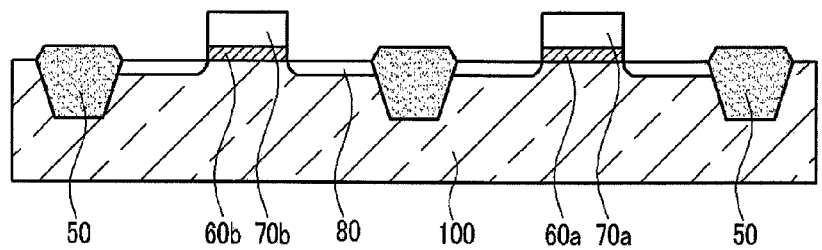
FIGS. 2 to 9 are example sectional views illustrating a process of manufacturing a semiconductor device according to embodiments.

Referring to FIG. 2, gate insulating layers 60a and 60b and gate electrodes 70a and 70b may be sequentially formed on semiconductor substrate 100. Isolation layers 50, and low-density dopants 80 may be implanted into exposed semiconductor substrate 100, for example by using gate electrodes 70a and 70b as masks.

Next, referring to FIG. 3, insulating layer 90, which may have a planarized top surface, may be formed on semiconductor substrate 100 and gate electrodes 70a and 70b. Photoresist 200 may be formed on insulating layer 90. In embodiments, insulating layer 90 may include BSG (boron silicate glass), PSG (phosphorous silicate glass), PE-TEOS, or the like.

Since it may be difficult to remove photoresist 200 if insulating layer 90 is excessively high, insulating layer 90 may be deposited in a thickness of approximately 5000 Å or less, and photoresist 200 may thereby be more easily removed.

Figure 4:
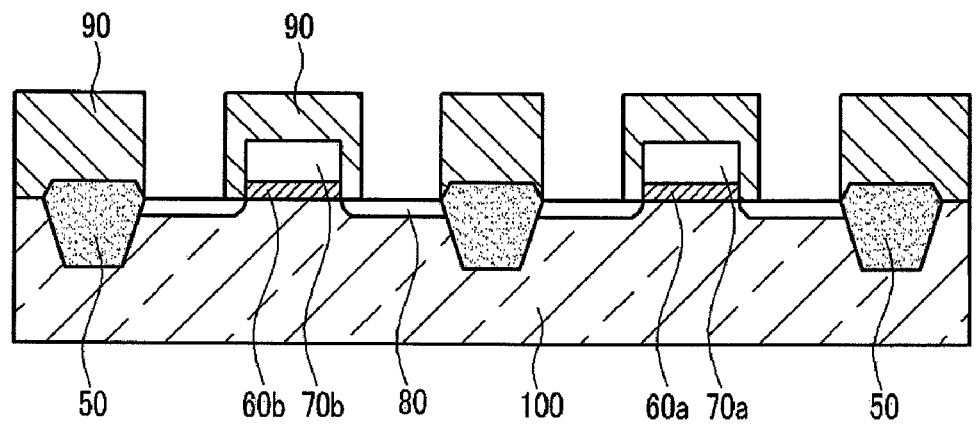

Referring to FIG. 4, insulating layer 90 may be patterned, for example using photoresist 200 as a mask. In embodiments, patterned insulating layer 90 may be formed at a prescribed thickness on a surface of each of the exposed gate electrodes 70a and 70b, and may also be positioned on isolation layer 50.

Figure 5:
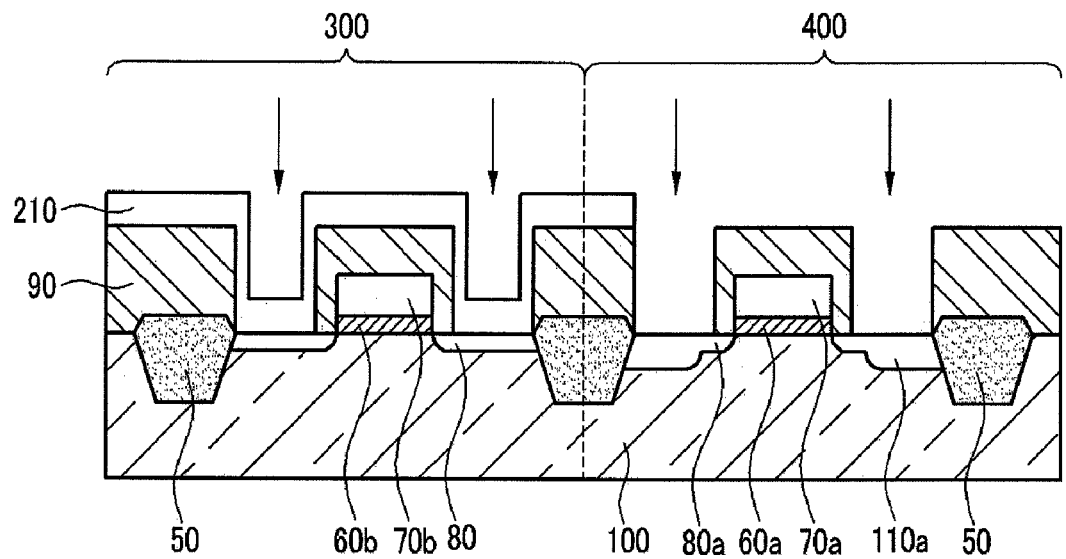

Next, referring to FIG. 5, an NMOS photoresist 210 may be formed on a surface (for example, the entire surface, in embodiments) of an upper structure of semiconductor substrate 100 corresponding to an NMOS (n-channel metal oxide silicon) region 300 and may thereby open a PMOS (p-channel metal oxide silicon) region 400. A trivalent ion, for example such as boron, may be implanted into semiconductor substrate 100 exposed in the PMOS (p-channel metal oxide silicon) region 400 and may thereby form a PMOS high-density junction region 110a. In embodiments, a low-density junction region 80a may be formed.

Figure 6:
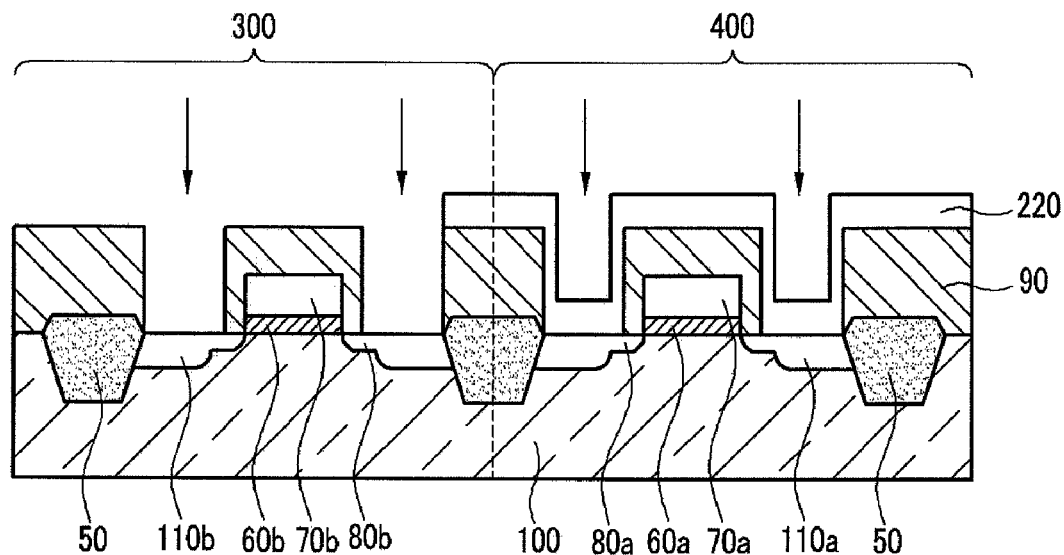

Referring to FIG. 6, NMOS photoresist 210 may be removed, and PMOS photoresist 220 maybe formed on a surface (for example, an entire surface, according to embodiments) of an upper structure of semiconductor substrate 100 in the PMOS region 400. Pentavalent ions, for example such as phosphorus, may then be implanted into semiconductor substrate 100 exposed in the NMOS region 300 and may thereby form an NMOS high-density junction region 110b. In embodiments, a low-density junction region 80b may be formed.

In embodiments, insulating layer 90 formed on gate electrodes 70a and 70b may be used to form a low-density junction region. Insulating layer 90 may also prevent the occurrence of punchthrough in a semiconductor device, and may perform the same function as a spacer used to isolate adjacent gate electrodes from each other. In embodiments, a width of insulating layer 90 formed on gate electrodes 70a and 70b may be adjusted through photoresist 200.

Further, insulating layer 90 may serve as a mask to form high-density junction regions 110a and 10b.

Figure 7:
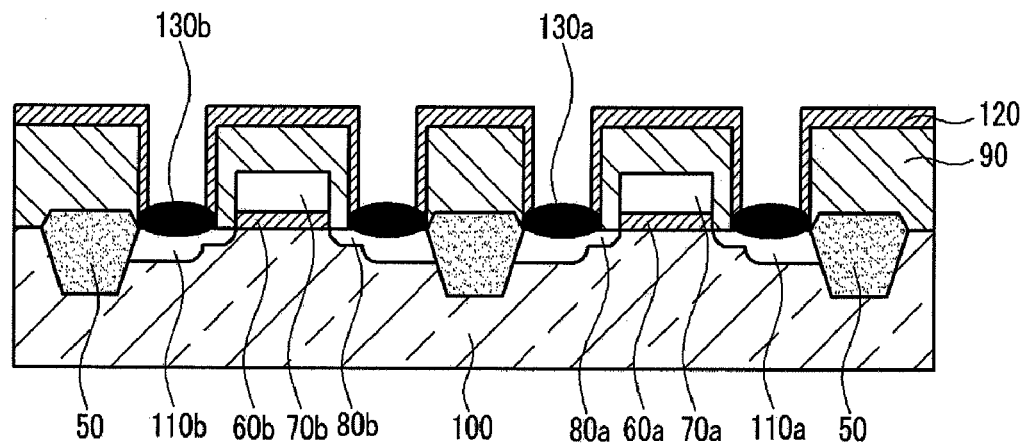

Referring to FIG. 7, PMOS photoresist 220 may be removed. First barrier metal film 120, for example such as a Ti film, a TiN film and/or a Ti/TiN double film, may be formed on insulating layer 90 and the exposed semiconductor substrate 100. A heating process may then be performed. In embodiments, first barrier metal film 120 adjacent to semiconductor substrate 100 may be changed into salicide layers 130a and 130b.

Figure 8:
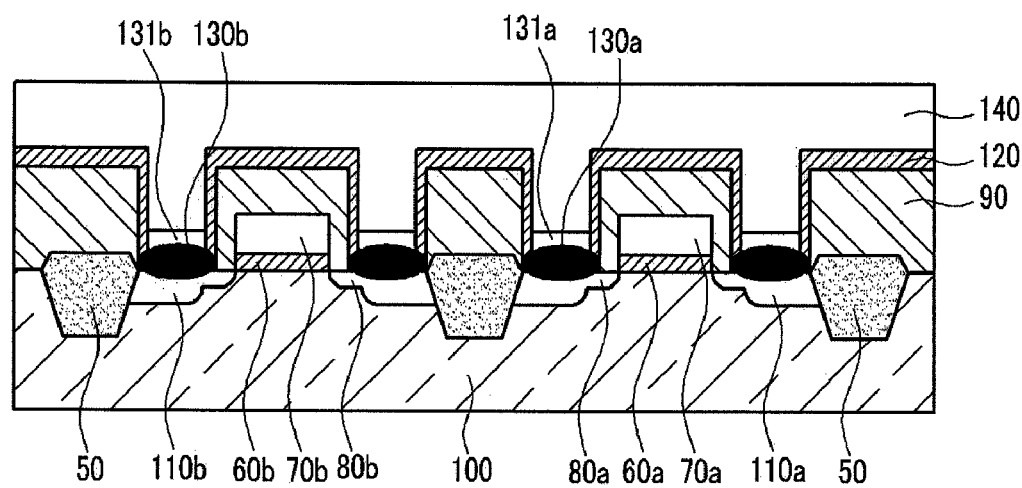

Referring to FIG. 8, second barrier metal films 131a and 131b, for example such as a Ti, TiN and/or Ti/TiN double film, may be formed on the salicide layers 130a and 130b, respectively. Metal layer 140, for example including Al, Cu or the like, may then be formed on first and second barrier metal films 120, 131a and 131b.

Figure 9:
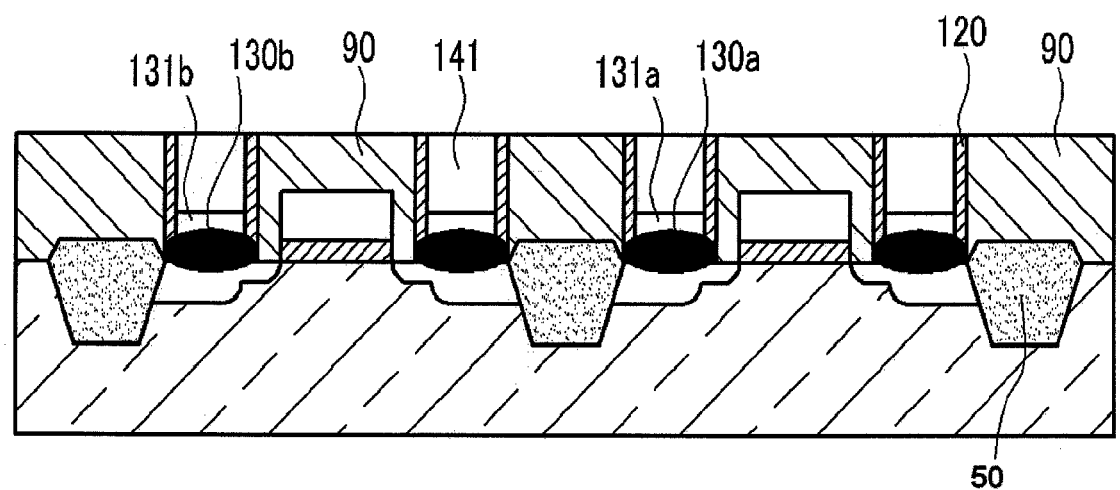

Referring to FIG. 9, metal layer 140 may be planarized, for example through a chemical mechanism polishing (CMP) process, and may thereby form metal interconnections 141.

In embodiments, insulating layer 90 may serve as a spacer, and may serve as an inter metal dielectric (MD) together with insulating layer 90 formed on isolation layer 50. Further, an isolation space between the adjacent insulating layers may become a path through which semiconductor substrate 100 and the metal interconnection 141 may be electrically connected.

According to embodiments, it may not be necessary to form a spacer and an inter metal insulating layer with a contact hole. Rather, in embodiments, a one-time process of forming an insulating layer may be performed, which may cause a process of manufacturing semiconductor devices to be simplified, a yield of products to increase, and manufacturing costs to be reduced.

Further, according to embodiments, since patterned insulating layer 90, which may be positioned on a top and on sidewalls of gate electrodes 70a and 70b to serve as a spacer, may have a width that may be adjusted by photoresist 200, an interior of a gap between gate electrodes, that may have a narrow isolation space in a highly integrated semiconductor device, may be sufficiently filled with an inter metal insulating film, and a void may be prevented. Accordingly, electrical characteristics and reliability of a semiconductor device may be enhanced.

According to embodiments, it may be advantageous that an insulating layer formed on tops and sides of an exposed gate electrode and an isolation layer may be substituted for an inter metal insulating layer a spacer and a contact hole, so that a process of manufacturing semiconductor devices may be simplified and costs may be reduced.

Further, in embodiments since an isolation space between gate electrodes may be reduced, it may be possible to prevent voids that may be caused when an interior of a gap between the gate electrodes is not sufficiently filled with an oxidation film. Thus, electrical characteristics and reliability of the semiconductor device may be enhanced.

It will be apparent to those skilled in the art that various modifications and variations can be made to embodiments. Thus, it is intended that embodiments cover modifications and variations thereof within the scope of the appended claims. It is also understood that when a layer is referred to as being "on" or "over" another layer or substrate, it can be directly on the other layer or substrate, or intervening layers may also be present.

What is claimed is:

1. A method comprising:
    forming a gate insulating layer and a gate electrode over a semiconductor substrate having an isolation layer;
    implanting low-density dopants into the semiconductor substrate to form a low-density junction region at both sides of the gate electrode;
    forming a patterned insulating layer partially exposing the low-density junction region; and
    implanting high-density dopants into an exposed portion of the low-density junction region of the semiconductor substrate to form a high-density junction region at both sides of the gate electrode,
    wherein said forming the patterned insulating layer comprises forming an insulating layer on a top of the isolation layer and on a side surface and a top of the gate electrode, wherein the patterned insulating layer is in direct contact with the top of the isolation layer, the side surface and the top of the gate electrode.

2. The method of claim 1, wherein forming the low-density junction region comprises implanting low-density dopants into the semiconductor substrate using the gate electrode as a mask.

3. The method of claim 1, wherein forming the patterned insulating layer comprises:

forming an insulating layer over a surface of the semiconductor substrate with the low-density junction region formed thereon;

forming a photoresist pattern on the insulating layer such that at least a portion of the insulating layer over the low-density junction region is exposed; and etching the insulating layer using the photoresist pattern as a mask such that at least a portion of the low-density junction region of the semiconductor substrate is exposed.

4. The method of claim 3, wherein a width of the patterned insulating layer is adjusted by the photoresist.

5. The method of claim 1, wherein forming the high-density junction region comprises:

opening a PMOS (p-channel metal oxide silicon) region by forming an NMOS (n-channel metal oxide silicon) photoresist over a surface of an upper structure of the semiconductor substrate corresponding to an NMOS region; and forming a PMOS high-density junction region by implanting a trivalent ion into the exposed PMOS region of the semiconductor substrate.

6. The method of claim 5, wherein forming the high-density junction region further comprises:

exposing the semiconductor substrate of the NMOS region by removing the NMOS photoresist and forming a PMOS photoresist on a surface of an upper structure of the semiconductor substrate corresponding to the PMOS region; and forming an NMOS high-density junction region by implanting a pentavalent ion into the exposed NMOS region of the semiconductor substrate.

7. The method of claim 1, further comprising:

forming a first barrier metal film over the patterned insulating layer and the semiconductor substrate with the low-density junction region exposed thereon after forming the high-density junction region; and forming a salicide layer over the low-density junction region of the semiconductor substrate by heat treating the semiconductor substrate with the first barrier metal film formed thereon.

8. The method of claim 7, wherein the first barrier metal layer comprises a Ti film.

9. The method of claim 7, wherein the first barrier metal layer comprises a TiN film.

10. The method of claim 7, further comprising:

forming a second barrier metal film over the salicide layer;

forming a metal layer over the first and second barrier metal films; and forming a metal interconnection by planarizing the metal layer.

11. The method of claim 10, wherein the second barrier metal layer comprises a TiN film.

12. The method of claim 10, wherein the second barrier metal layer comprises a Ti film.

13. The method of claim 1, wherein the patterned insulating layer comprises at least one of BSG (boron silicate glass), PSG (phosphorous silicate glass), and PE-TEOS.

* * * * *